United States Patent [19]

Wehrli et al.

[11] Patent Number: 5,247,934

[45] Date of Patent: Sep. 28, 1993

[54] METHOD AND APPARATUS FOR DIAGNOSING OSTEOPOROSIS WITH MR IMAGING

[75] Inventors: Felix W. Wehrli, Bala Cynwyd, Pa.; Steven D. Kugelmass, Teaneck, N.J.

[73] Assignee: Trustees of the University of Pennsylvania, Philadelphia, Pa.

[21] Appl. No.: 743,265

[22] Filed: Aug. 9, 1991

[51] Int. Cl.$^5$ ............................................ A61B 5/055
[52] U.S. Cl. ............................... 128/653.2; 364/413.13
[58] Field of Search ....................... 128/653.1, 653.2; 324/307, 308, 309; 364/413.13, 413.14, 413.15, 413.17

[56] References Cited

U.S. PATENT DOCUMENTS

| | | | |
|---|---|---|---|
| 4,635,643 | 1/1987 | Brown | 324/308 |
| 4,721,112 | 1/1988 | Hirano et al. | 128/659 |
| 4,829,549 | 5/1989 | Vogel et al. | 128/653.1 |
| 4,850,372 | 7/1989 | Ko et al. | 128/653.1 |
| 4,903,203 | 2/1990 | Yamashita et al. | 364/413.2 |
| 4,922,915 | 5/1990 | Arnold et al. | 128/653.1 |
| 4,976,267 | 12/1990 | Jeffcott et al. | 128/660.01 |
| 5,038,786 | 8/1991 | Kojima | 128/653.2 |
| 5,081,992 | 1/1992 | Levin et al. | 128/653.2 |

FOREIGN PATENT DOCUMENTS 1100236  6/1984  U.S.S.R. ............................. 128/653.1

OTHER PUBLICATIONS

Parfitt, "Age-related Structural Changes in Trabecular and Cortical Bone: Cellular Mechanisms and Biomechanical Consequences," Calcif Tissue Int 36: 123-5128, 1984.
Kleerekoper et al., "The Role of Three-Dimensional Trabecular Microstructure in the Pathogenesis of Vertebral Compression Fractures," Calcif Tissue Int 37:594-597, 1985.
Weinstein et al., "Decreased Trabecular Width and Increased Trabecular Spacing Contribute to Bone Loss with Aging," Bone 8:137-142, 1987.
Whitehouse, "The Quantitative Morphology of Anisotropic Trabecular Bone," J Microsc 101:153-168, 1974.
Gundersen, et al., "Some New, Simple and Efficient Stereological Methods and Their Use in Pathological Research and Diagnosis," APMIS 96:379-394, 1988.
Schenck et al., "High Resolution Magnetic Resonance Imaging Using Surface Coils," Magnetic Resonance Annual (1986).
Bittoun et al., "In Vivo High-Resolution MR Imaging of the Skin in a Whole-Body System at 1.5T," Radiol 176:457-460, 1990.
Parfitt et al., "Relationships Between Surface, Volume, and Thickness of Iliac Trabecular Bone in Aging and in Osteoporosis," J. Clin. Invest. 72:1396-1409, 1983.
Williams et al., "Properties and an Anisotropic Model of Cancellous Bone from the Proximal Tibial Epiphysis," J Biomechanical Engineering 104:50-56, 1982.
Raux et al., "Trabecular Architecture of the Human Patella," J Biomechanics 8:1-7, 1975.
Wehrli et al., "MR Microscopy of Trabecular Microstructure In Vitro and In Vivo," J. Magn Res Imaging 1:221-222, 1991.

Primary Examiner—Lee S. Cohen
Assistant Examiner—K. M. Pfaffle
Attorney, Agent, or Firm—Woodcock Washburn Kurtz Machiewicz & Norris

[57] ABSTRACT

Methods are provided for detecting and diagnosing osteoporosis using high-resolution NMR imaging of trabecular bone. One such method comprises the steps of obtaining high-resolution NMR imaging data indicative of the trabecular microstructure of a mass of bone, analyzing the imaging data to determine the density of the trabeculae of the bone, comparing the density thus obtained with reference trabecular density data, and determining on the basis of the comparison whether the subject is osteoporotic or normal. To determine trabecular density, bone volume can be computed as the area fraction of those pixels that by virtue of their characteristic pixel intensity can be assigned to bone. Trabecular thickness can be computed from the relative bone area in a region of interest divided by half the perimeter length, the perimeter length being the circumference of all bone islands observed in the region of interest. Trabecular density can be expressed as the mean number of intercepts of parallel search lines perpendicular to the orientation of the trabeculae or as the ratio of mean trabecular thickness divided by the bone area within the region of interest.

9 Claims, 3 Drawing Sheets

METHOD AND APPARATUS FOR DIAGNOSING OSTEOPOROSIS WITH MR IMAGING

FIELD OF THE INVENTION

The present invention generally relates to the field of characterizing bone and particularly relates to characterizing trabecular bone with nuclear magnetic resonance (NMR) imaging. The invention more particularly relates to a method and apparatus for diagnosing diseases that affect trabecular bone, such as osteoporosis, with NMR imaging.

BACKGROUND OF THE INVENTION

Bone in vertebrates has both a structural and metabolic function. Its major structural function is to provide support for the body against gravity and to act as a lever system for muscular action. Bone consists of a mineralized phase (essentially calcium hydroxy apatite, approximately 50% by volume) and an organic phase (osteoid) mainly composed of collagen. In addition, bone may be organizationally and functionally subdivided into trabecular (cancellous) and cortical bone. Trabecular bone consists of a three-dimensional gridwork whose individual components (the trabeculae) are plates and struts 100–300 μm thick with the mean intertrabecular space varying between about 500 and 1500 μm. The function of the trabecular structure is to provide the skeleton with mechanical strength. Trabeculation is reduced with a concomitant loss in bone strength as a result of normal aging and disease processes such as osteoporosis.

Aging is associated with a progressive decrease in bone mass that is more prominent in women than in men. For example, most women have lost 40–50% of their peak trabecular mass by the time they are 90 years old while men have lost 10–20% by that age. In addition, symptomatic osteoporosis affects more than 15 million post-menopausal American women. Moreover 25% of all women over the age of 60 years have had at least one spinal compression fracture. The biomechanical and structural aspects of osteoporosis therefore assume exceptional practical importance in clinical medicine. Its diagnosis is similarly of great significance.

Bone mineral density is governed by a variety of metabolic processes controlled by growth hormones, sex hormones and glucocorticoids. For example, estrogen deficiency following menopause or prolonged amenorrhea is known to be associated with bone loss. It is generally recognized that bone mineral density is an important, albeit not complete, descriptor of bone strength. The biomechanical consequences of bone loss during normal aging and osteoporosis have been studied widely See Parfitt, "Age-related Structural Changes in Trabecular and Cortical Bone: Cellular Mechanism and Biomechanical Consequences," *Calcif Tissue* Int 36: S123-S128, 1984; Kleerekoper et al., "The Role of Three-Dimensional Trabecular Microstructure in the Pathogenesis of Vertebral Compression Fractures," *Calcif Tissue Int* 37: 594–597, 1985; Vesterby et al., "Unbiased Stereological Estimation of Osteoid and Resorption Fractional Surfaces in Trabecular Bone Using Vertical Sections. Sampling Efficiency and Biological Variation," *Bone,* 1988; Weinstein et al., "Decreased Trabecular Width and Increased Trabecular Spacing Contribute to Bone Loss with Aging," *Bone* 9: 137–142, 1987.

Two different mechanisms of bone loss have been proposed: Rapid bone loss is believed to be the result of excessive deepening of the osteoclastic resorption cavities, a condition which eventually leads to perforation of the trabeculae, increased size of the marrow spaces and disruption of the bone structure. Slow bone loss results from incomplete refilling by osteoblasts of the resorption cavities. This causes simple thinning of the residual structural elements and thus reduces bone strength in proportion to the amount of bone.

It is also known that bone mass alone is an inadequate descriptor of bone strength. In fact, there is growing evidence that structural parameters may be equally important. Even in studies of large populations there remains considerable overlap between the fracture and normal groups. It has been shown that a quantity of bone mass distributed as widely spaced, disconnected, thick trabeculae is biomechanically less competent than when arranged as numerous, connected, thin plates. In a sex, race and age-matched study of 26 osteoporotic postmenopausal females and 24 control subjects the fractional bone mass was not significantly lower for the subjects with fractures. However, mean trabecular plate density and mean trabecular plate separation were significantly different for the two populations ($p < 0.001$ and $p < 0.005$, respectively (where p represents the probability of the association being fortuitous)). The same group of researchers also found that the loss of trabecular bone that accompanies normal aging results predominantly from a reduction in the number of structural elements with only a slight reduction in the thickness of the remaining elements.

The conventional approach to morphologic measurements of bone makes use of sectioning trabecular bone from frozen specimens, followed by polishing of the surface and subsequent marrow removal. Stereological measurements are then performed on electron micrographs or low magnification (25–30 x) photographs of the cut surfaces of the trabeculae. In this technique the depth-of-field is optimized so that only the cut surfaces of the trabeculae are seen in sharp focus, thus enabling surface measurements to be made without embedding the bone in plastic and sectioning thin slices. This approach is also suitable for image analysis. See Austriaco et al., "Trabecular Bone Densitometry Using Interactive Image Analysis," *J Biomed Eng,* in press, 1991. Further information about conventional tools and mathematical approaches for stereologic analysis of trabecular bone are available in the literature. See, e.g., Whitehouse, "The Quantitative Morphology of Anisotropic Trabecular Bone," *J Microsc* 101: 153–168, 1974; Gundersen, et al., "Some New, Simple and Efficient Stereological Methods and Their Use in Pathological Research and Diagnosis," *AMPIS* 96:379–394, 1988.

Alternative procedures for preparing the bone for stereologic analysis involve embedding the specimen in polymethymethacrylate resin followed by sectioning. The resulting plastic block is machined into thin sections of 100–200 μm thickness. The specimen sections are then further reduced in thickness by polishing to achieve a smooth surface. This procedure is labor intense and requires substantial operator skills. More importantly, however, it only permits measurements in a single plane, thus it may not afford a statistically meaningful measurement of the relevant stereological parameters. Further, by its very nature the method is destructive in that the bone specimen is rendered useless for other measurements, such as analysis in a secondary plane.

Osteoporosis is a widespread disease predominantly afflicting postmenopausal women. As a chronic disease, it may be silent for decades until resulting in fractures late in life. As a result of demineralization and gradual depletion of the trabecular microstructure, the weight-carrying capacity of the bone decreases, leading to atraumatic fractures. The present inventor's copending application Ser. No. 703,411, filed May 21, 1991, provides further background on the causes and effects of osteoporosis and is incorporated by reference herein. The two currently used methods for diagnosis and therapy follow-up are single or dual photon absorptiometry (SPA and DPA, respectively) and quantitative computed tomography (QCT). Those methods, however, are invasive in that they use ionizing radiation. Moreover, their scope is limited in that they measure bone mineral density without providing information on the trabecular microstructure (i.e., the geometry, thickness, orientation and density of the trabecular plates), which is commonly obtained by optical stereology, whereby thin sections of bone biopsy specimens are microscopically analyzed.

Despite extensive research into methods of characterizing bone and the cause and treatment of osteoporosis, there is still a need for noninvasive methods for acquiring information about the trabecular microstructure and for detecting and diagnosing diseases such as osteoporosis that affect trabecular bone.

OBJECTS OF THE INVENTION

One of the objects of the present invention is to provide noninvasive methods and apparatus for acquiring information about the microstructure of a mass of trabecular bone. A further object of the present invention is to provide methods for acquiring quantitative information on trabecular plate density from an analysis of NMR imaging data. A still further object of the present invention is to provide methods of detecting and diagnosing osteoporosis and other diseases affecting trabecular bone.

SUMMARY OF THE INVENTION

The present invention achieves the aforementioned objects by providing methods for detecting a condition of a mass of trabecular bone that comprise the steps of subjecting the mass of bone to electromagnetic energy so as to cause a response comprising a first parameter indicative of the density of the trabeculae of the bone, measuring said first parameter, and comparing said first parameter with data corresponding to a second mass of bone having a known condition, whereby the condition of the mass of bone is determined.

In one embodiment of the present invention, the first parameter is measured by nuclear magnetic resonance (NMR) imaging. Another embodiment of the present invention further comprises comparing the first parameter with trabecular density data for a mass of bone that has a known trabecular structure. Still another embodiment of the present invention further comprises the step of determining on the basis of the comparison whether the subject is osteoporotic or normal.

In still another embodiment the step of measuring the first parameter comprises the following steps: computing a second parameter indicative of bone area or volume in a region of interest (ROI); computing, on the basis of the second parameter, a third parameter indicative of trabecular thickness in the said ROI; and computing the first parameter on the basis of a ratio of the third parameter to the second parameter.

In yet another embodiment of the present invention the step of computing the second parameter comprises the steps of obtaining NMR imaging data for the ROI, comparing the said NMR imaging data to a prescribed first threshold value, selecting a first portion of the data on the basis of the comparison with the first threshold value, and computing a first weighted sum on the basis of the first portion.

Still yet another embodiment of the present invention further comprises comparing the imaging data for the ROI to a prescribed second threshold value, selecting a second portion of the data on the basis of the comparison to the second threshold value, computing a second sum on the basis of the second portion, computing a third sum on the basis of all of the data for the ROI, and computing the ratio of the sum of the first weighted sum and the second sum to the third sum.

The present invention also encompasses methods for detecting osteoporosis in a mass of bone. Such methods comprise the steps of obtaining NMR imaging data indicative of the trabecular microstructure of the said mass of bone; analyzing the said imaging data to determine a first parameter indicative of the density of the trabeculae of the bone; comparing the said first parameter with trabecular density data for a mass of bone that has a known trabecular structure; and determining on the basis of the comparison whether the subject is osteoporotic or normal.

Preferred methods include the steps of obtaining NMR imaging data indicative of the trabecular microstructure of a mass of bone, analyzing the imaging data to determine the mean density of the trabeculae of the bone, comparing the mean density thus obtained with reference trabecular density data, and determining on the basis of the comparison whether the subject whose bone was imaged is osteoporotic. In the step of determining the mean trabecular density, bone volume is first computed as an area fraction of pixels that by virtue of their intensity are assigned to bone, the computation carried out using segmentation techniques on histogram-equalized binary images. The mean trabecular thickness is then computed from the relative bone area in a region of interest divided by half the perimeter length, the perimeter length being the circumference of all bone islands observed in the region of interest. The mean trabecular density is then expressed as one of either (i) the mean number of intercepts of parallel search lines perpendicular to the orientation of the trabeculae or (ii) the ratio of mean trabecular thickness divided by the bone area within the region of interest.

The present invention also encompasses apparatus for detecting a condition of a mass of trabecular bone. Apparatus in accordance with the present invention comprise first means for subjecting the mass of bone to electromagnetic energy so as to cause a response comprising a first parameter indicative of the density of the trabeculae of the bone, second means for measuring said first parameter, and third means for comparing said first parameter with data corresponding to a second mass of bone having a known condition, whereby the condition of the mass of bone is determinable.

It should be noted that typical in vivo NMR images provide pixel sizes of 0.5-1 mm and section thicknesses of 2-3 mm. Those resolutions are insufficient for trabecular analysis, which requires resolutions comparable to the size of the structural elements (e.g., thickness and spacing of the trabeculae). In practice, this requires pixel sizes of less than 100 μm and slice thicknesses of 500 μm or less. The present inventor has discovered that such resolutions are achievable when imaging trabecular bone, which is an important aspect of the present invention. Other features and advantages of the invention are described below in connection with the detailed description of preferred embodiments.

DETAILED DESCRIPTION OF PREFERRED EMBODIMENTS

Figure 1:
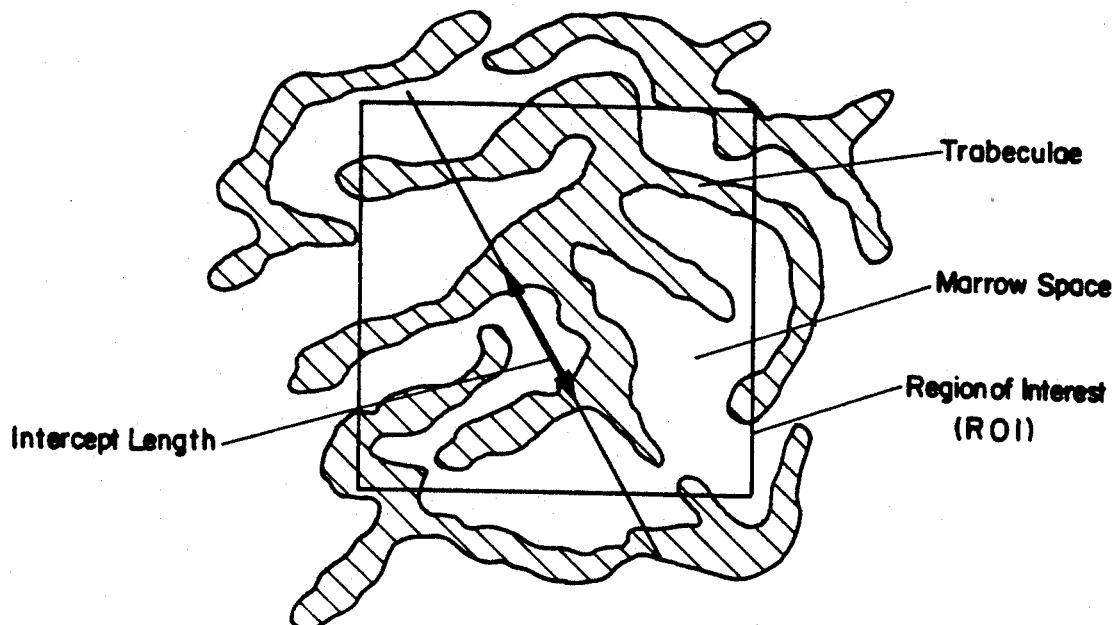
FIG. 1 is an example of a planar section of a trabecular bone.

Preferred embodiments of the present invention are based on the fact that proton NMR imaging of the marrow contents provides images that have high contrast between the bone marrow and the trabeculae. It has been found that, due to that high intrinsic contrast, high-resolution images suited for quantitative stereologic analysis can be obtained in even relatively low signal-to-noise regimes.

TECHNICAL REQUIREMENTS FOR HIGH-RESOLUTION IMAGING

Spatial resolution in NMR imaging is inversely proportional to gradient strength and proportional to receiver bandwidth. The ultimate practical limitation, however, is the signal-to-noise ratio (SNR). SNR can be boosted by operating the NMR imaging system at the highest possible field strength and by reducing the size of the object using very closely coupled coils. See Schenck et al., "High-resolution Magnetic Resonance Imaging Using Surface Coils," *Magnetic Resonance Annual* (1986).

In two-dimensional (2D) Fourier Transform (FT) imaging, the pixel size $\Delta x$, $\Delta y$ in the frequency and phase-encoding directions are determined by the amplitude of the frequency-encoding gradient $G_x$, the amplitude of the phase-encoding gradient $G_y(t)$ and its time integral $\int G_y(t)dt$, the sampling frequency bandwidth BW and the gyromagnetic ratio $\gamma$ as follows:

$$\Delta x = \frac{2\pi BW}{M_x \gamma G_x} \quad (1)$$

$$\Delta y = \frac{\pi}{\gamma \int G_y(t)dt} \quad (2)$$

Further, the bandwidth per pixel is required to exceed the line width $\Delta v$, i. e., $$\frac{BW}{\text{pixel}} > \Delta v \quad (3)$$

The typical limitations imposed by the gradient strength of a commercial NMR imager ($G_{max}$ approximately 1 G/cm) can to some extent be overcome by lowering the bandwidth (frequency encoding) and increasing the duration of the phase-encoding gradient (phase encoding). By reducing the bandwidth from ±16 kHz to ±4 kHz, the minimally achievable field of view can be lowered to about 2 cm which, at a matrix size of 256×256, affords a pixel size of 80 μm. The trade-off is an increase in sampling period $T_s$, which is given by:

$$T_s = \frac{N_f}{BW} \quad (4)$$

where $N_f$ represents the number of frequency-encoding samples. Under these conditions the sampling time increases to 32 ms with a minimum echo time of approximately 50 ms. It is apparent, however, that at a typical line width of 10 Hz, the inequality expressed by equation 3 is still satisfied.

Similar limitations occur in the slice-selection direction. The slice thickness is given by the relationship:

$$\Delta z = \frac{2\pi BW_{RF}}{\gamma G_z} \quad (5)$$

where $BW_{RF}$ represents the bandwidth (in Hz) of the sinc-modulated RF pulse and $G_z$ represents the slice-selection gradient amplitude. At the standard bandwidth of 1.25 kHz on a General Electric Signa scanner, the minimum slice thickness, at a maximum gradient amplitude of 1 G/cm, according to equation 5 is 3 mm. Reducing the bandwidth permits reducing the slice thickness, albeit at the expense of an increase in the RF pulse duration and a deterioration of the slice profile.

It thus becomes evident that a commercial instrument is typically not suited for obtaining the required resolution and that adaptations need to be made, particularly to the gradient subsystem. See, e.g., Bittoun et al., "In Vivo High-resolution MR Imaging of the Skin in a Whole-body System at 1.5 T," *Radiol* 176:457–460, 1990. Further modifications involve the design of RF coils tailored to the anatomy of interest, as described below.

DATA ANALYSIS

Microscopic NMR images obtained in vitro or in vivo are useful in the measurement of micromorphometric parameters, such as bone volume, trabecular thickness, intercept length, and fabric tensor, provided they satisfy the requirements described above in terms of spatial resolution and signal-to-noise ratio. The conventional methodology for the derivation of these stereologic parameters is described in the following articles: Parfitt, "Age-related Structural Changes in Trabecular and Cortical Bone: Cellular Mechanism and Biomechanical Consequences," cited above. Kleerekoper et al., "The Role of Three-dimensional Trabecular Microstructure in the Pathogenesis of Vertebral Compression Fractures," *Calcif Tissue Int* 37: 594–597, 1985. Parfitt et al., "Relationships Between Surface, Volume, and Thickness of Illiac Trabecular Bone in Aging and in Osteoporosis," *J Clin Invest* 72: 1396-1409, 1983. Williams et al., "Properties and an Anisotropic Model of Cancellous Bone from the Proximal Tibial Epiphysis," *J Biomechanical Engineering* 104:50–56, 1982. Austriaco et al., "Trabecular Bone Densitometry Using Interactive Image Analysis," *J Biomed Eng* in press: 1991.

Whitehouse, "The Quantitative Morphology of Anisotropic Trabecular Bone," *J Microsc* 101: 153-168, 1974. Gundersen, "Some New, Simple and Efficient Stereological Methods and Their Use in Pathological Research and Diagnosis," *APMIS* 96:379-394, 988. Parfitt, "Age-related Structural Changes in Trabecular and Cortical Bone: Cellular Mechanisms and Biochemical Consequences," cited above.

The present invention provides improved approaches for the derivation of the stereologic parameters (bone volume, trabecular thickness, intercept length, etc.). In accordance with the present invention the bone volume is computed as the area fraction of those pixels that by virtue of their characteristic pixel intensity can be assigned to bone. The computation is carried out using segmentation techniques on the histogram-equalized binary images. Trabecular thickness is computed from the relative bone area in a region of interest divided by half the perimeter length. The perimeter length is the circumference of all bone islands observed in the region of interest. Trabecular density may then be expressed as the mean number of intercepts of parallel search lines perpendicular to the orientation of the trabeculae or as the ratio of mean trabecular thickness divided by the bone area within the region of interest.

The foregoing relationships are illustrated in FIG. 1, an exemplary planar section through trabecular bone. FIG. 1 shows a square box representing a region of interest (ROI) superimposed on trabeculae surrounded by bone marrow. The area corresponding to bone within the ROI, divided by the total area within the ROI, is the area fraction of bone, which is equal to the volume fraction. The mean trabecular thickness may be computed as the total area of bone within the ROI divided by half the perimeter length, i.e., half the total circumference of all trabeculae within the ROI. The mean bone intercept length is the mean distance between two trabeculae along some fiduciary direction. The mean trabecular plate density is proportional to the bone area within the ROI divided by the mean trabecular thickness.

NMR MICROSCOPY OF BONE SPECIMENS IN VITRO

High-field NMR microscopy was performed on a Bruker AM-400 9.4 Tesla (400 MHz proton frequency) wide-bore spectrometer equipped with a 50 Gauss/cm gradients micro-imaging accessory. 2D FT spin-warp spin-echo imaging with a section thickness ranging from 375-150 $\mu$m was used with a field of view of 20 mm and matrix size of 256×256 and 512×512, affording an in-plane spatial resolution of 80 and 40 $\mu$m, respectively. The pulse repetition time was varied between 0.5 and 2 seconds and 2-8 excitations were used. Sample longitudinal and transverse images representing different resolution regimes and imaging section thicknesses were obtained for a specimen of bovine tibia. The images obtained clearly depict the highly anisotropic tubular structure of the trabeculae. After image reconstruction on the ATM-400's ASPECT host computer, the image data was transferred by ½-inch nine-track tape to a Sun Microsystems 4/280 workstation. The data was then converted from the native ASPECT format, which uses 24 bits per pixel, to a 16 bit per pixel file format used by VIDA TM (developed at the University of Pennsylvania) by scaling the dynamic range actually used to the maximum range supported by 16 bits.

Whereas an in-plane spatial resolution of 50 $\mu$m is usually sufficient for accurate stereologic analysis of micromorphometric parameters such as trabecular bone fraction or trabecular thickness (trabeculae are typically 100-150 $\mu$m wide and the intertrabecular space is typically on the order of 300-500 $\mu$m), the finite section thickness of NMR images can introduce severe errors due to partial volume averaging in those cases where the trabeculae obliquely transect the imaging plane.

Figure 2:
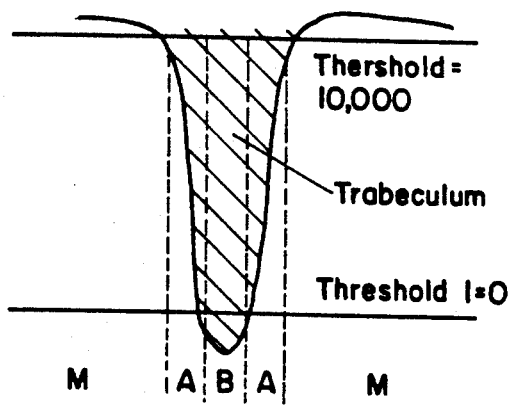
FIG. 2 is an illustration of how image data can be compared to first and second threshold values to determine the fraction of bone in a region of interest in accordance with the present invention.

Analysis of the area bone fraction requires segmentation of the images into bone and marrow. The most straightforward approach to segmentation comprises thresholding and creation of a binary image. Unfortunately, shading due to RF and static magnetic field inhomogeneity as well as the previously mentioned partial volume effect, different receiver gain, etc., usually render this approach impractical. In light of these problems, an algorithm was devised that is relatively immune to such sources of error. First, the histograms of the images were equalized by scaling such that the maximum pixel intensity was the same for all images. Next, two thresholds were selected, one near the maximum and one near the minimum signal. Three regions can typically be distinguished: one pertaining to bone (region B), one pertaining to marrow (M), and one consisting of partial volume averaged bone and marrow (region A), as depicted in FIG. 2. The relative bone area may then be obtained as a weighted sum of the pixels in zones B and A. The area fraction of bone may then be computed as:

$$A_b = \frac{\Sigma B_i + \Sigma nB_iA_i}{\Sigma(A_i + B_i + M_i)} \tag{6}$$

where $A_i$, $B_i$ and $M_i$ represent the pixel values in the respective regions, $nB_i$ represents the fractional bone content of the ith pixel in region A and the summation is over all pixels in the respective areas.

The method's effectiveness and relative immunity to partial volume effects is demonstrated by the data in Table I, which summarizes the results of an analysis of multiple sections of the bovine tibia specimen. The excellent agreement between measurements performed in different resolution regimes should be noted.

TABLE 1

Bone area fraction (%) measurement using the dual threshold technique for segmentation with automatic threshold setting based upon an analysis of the bimodal histogram. Bone was bovine tibia, in vitro. (Std represents standard deviation and S/T represents slice thickness.)

| S/T Pixel size | 375 $\mu$m 80 $\mu$m | 375 $\mu$m 45 $\mu$m | 150 $\mu$m 80 $\mu$M | 150 $\mu$m 40 $\mu$m | Average | Std |
|---|---|---|---|---|---|---|
| Slice A | 24.87 | 24.96 | 26.13 | 25.85 | 25.4525 | 0.63 |
| Slice B | 24.32 | 24.98 | 26.64 | 25.98 | 25.4800 | 1.03 |
| Slice C | 23.50 | 24.49 | 22.79 | 24.09 | 23.7175 | 0.74 |
| Slice D | 24.77 | 25.2 | 24.64 | 25.49 | 25.0250 | 0.39 |
| Average | 24.365 | 24.9075 | 25.05 | 25.3525 | | |
| Std | 0.62 | 0.29 | 1.72 | 0.86 | | |

IN VIVO MICROSCOPY OF HUMAN TRABECULAR STRUCTURE AT 1.5 T

Even if the necessary voxel size permitting sufficient resolution for quantitative analysis of trabecular microstructure can be attained, a significant potential impediment to do so may be SNR. Because of the small size of the sample, closely coupled coils encompassing the object can be designed for in vitro studies. In vivo, on the other hand, the anatomy imposes practical limitations, particularly the need for sufficient penetration. For this purpose, the present inventor evaluated small circular surface coils ranging in diameter from 7-2 cm by imaging the distal radius, calcaneus and patella. The high-resolution images of the distal radius in the axial and coronal plane obtained with those coils correspond to a voxel size of $150 \times 300 \times 3000$ $\mu m^3$ and clearly demonstrate the highly anisotropic nature of the trabecular structure.

Sagittal images of the patella with much improved resolution, corresponding to a voxel size of $115 \times 230 \times 2000$ $\mu m^3$, were obtained by means of a small 2 cm diameter surface coil. The patella is an ideal structure for imaging because the anterior cortical surface is minimally covered by soft tissue, thus permitting the use of a surface coil with very small penetration depth. The images obtained clearly reveal zones of different trabecular orientation, which are characteristic of the multidirectional stress to which the patella is subjected. See Raux et al., "Trabecular Architecture of the Human Patella," *J Biomechanics* 8: 1-7, 1975. In the sagittal plane, e.g., it was noticed that the orientation of the trabecular sheets near the anterior cortical surface is vertical, whereas posteriorly the orientation is horizontal. While the trabecular morphology of the patella is known from studies in vitro, this is to the inventor's knowledge the first time it has been demonstrated in vivo.

IN VIVO STUDIES AT 1.9 T

More powerful gradient coils affording gradient amplitudes of 4 G/cm have been developed at the inventor's institution (the University of Pennsylvania). A two-turn saddle coil, series-fed and capacitively coupled with a loaded Q of 240, operating in a transmit and receive mode, was used in conjunction with those gradient coils to produce a microscopic image of the human index finger. See Wehrli et al., "MR Microscopy of Trabecular Microstructure In Vitro and In Vivo," *I Magn Res Imaging* 1:221-222, 1991. The image has a voxel size of $100 \times 100 \times 1000$ $\mu m^3$ and represents, to the best of the inventor's knowledge, the highest resolution ever obtained in vivo in humans. The image obtained clearly shows individual trabeculae; moreover its quality lends itself to the measurement of stereologic parameters. This data lends further support to the theory that in vivo micromorphometry of trabecular bone by NMR is practical. Provisions must be made for imaging at comparable resolutions in a whole-body scanner to perform such measurements at anatomic locations other than the finger.

In a preferred embodiment, the invention permits in vivo analysis of trabecular microstructure in humans on a screening device that incorporates the features and technology described above. Preferred sites of measurement are the finger, patella, calcaneus and radius, since the trabecular bone in each of those regions is close to the surface, which permits the use of small dedicated surface coils that provide the highest sensitivity and thus permit measurements at image voxel sizes of less than 100 $\mu m^2$. Another motivation for examining those anatomic structures is their peripheral location, which permits the use of a small magnet having a bore size not exceeding 30 cm, thus minimizing cost, which is critical for a screening device.

The ideal operating field of the magnet is 2-4 T, however higher fields are advantageous from a sensitivity point of view since SNR is known to vary in proportion to changes in field strength. See Hoult et al., "The Sensitivity of the Zeugmatographic Experiment Involving Human Subjects," *J Magn Reson* 34: 425-33, 1979. The ultimate choice of field strength will be dictated by the anticipated cost/benefit ratio. Since coil resistance is dominant in very small coils, the gain in SNR due to increased field strength will be substantial (e.g., doubling of field strength increases SNR between 2 and 3-fold, depending upon whether coil or object resistance dominates). Such a system should provide gradients of at least 10 G/cm in three orthogonal directions.

One preferred imaging technique is a three-dimensional spin-echo volume technique affording isotropic images suited for reformation such that the stereologic analysis may be performed in any arbitrary direction. The analysis of the stereologic parameters will preferably be performed on the imaging system's host computer, which will also provide a list of all the relevant quantities discussed above. Means may also be provided for permitting a trained physician to immediately assess fracture risk by comparing the output data with previously obtained age-matched data for a normal population.

The invention may also be used for therapeutic follow-up for patients who undergo hormone treatment or other bone enhancing drug therapy.

Figure 3:
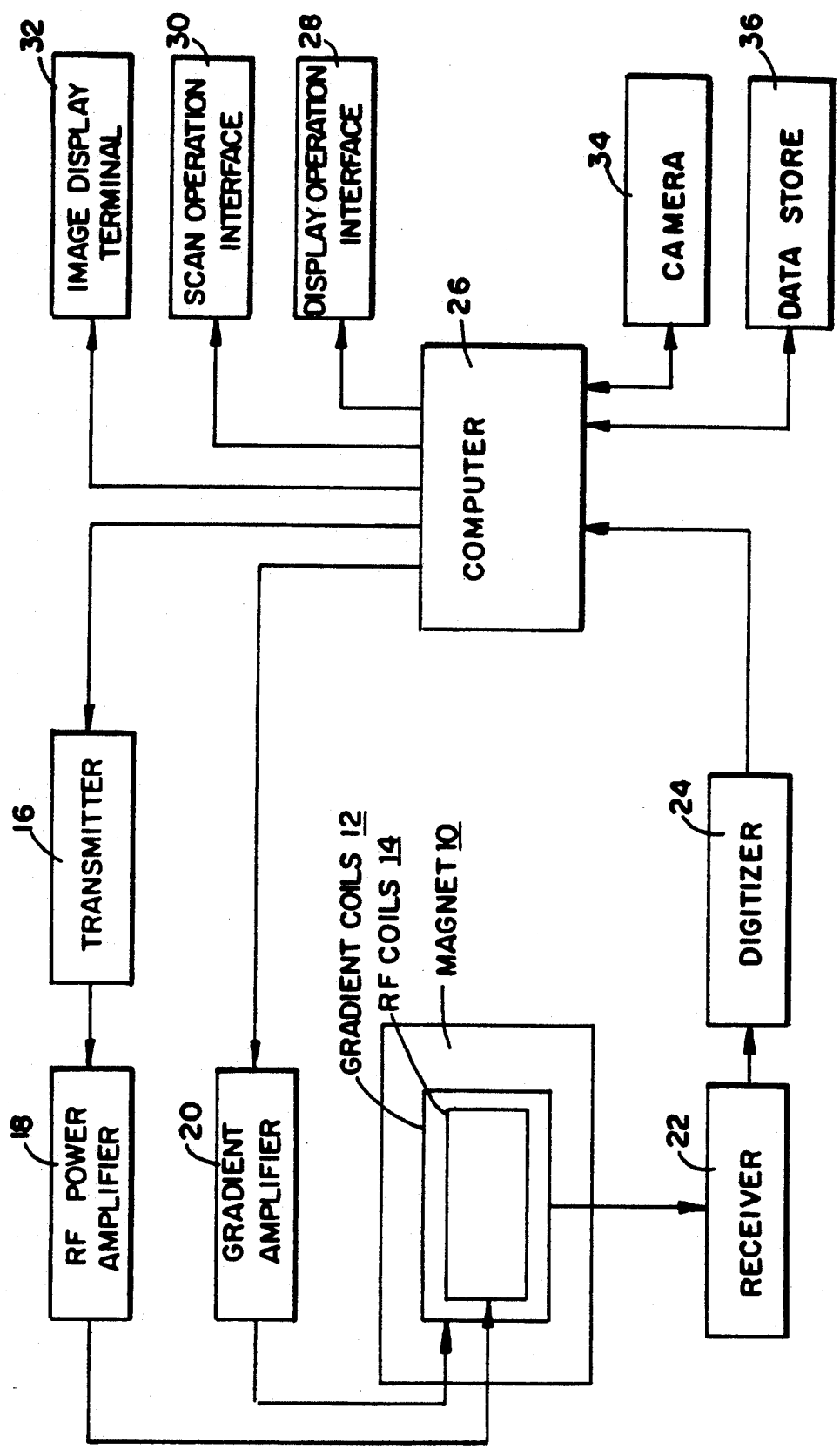
FIG. 3 is a block diagram of an exemplary nuclear magnetic resonance imaging system.

FIG. 3 is a block diagram of a magnetic resonance imaging system that may be programmed to noninvasively detect osteoporosis in accordance with the present invention. The system comprises a magnet 10, gradient coils 12, RF coils 14 (the RF coils should be scaled to the anatomy of interest), transmitter 16, RF power amplifier 18, gradient amplifier 20, receiver 22, digitizer 24, computer 26, display interface 28, scan operation interface 30, image display terminal 32, camera 34 and data store 36. The computer 26 is programmed to acquire and analyze data to detect osteoporotic bone in accordance with the above-described methods.

Figure 4:
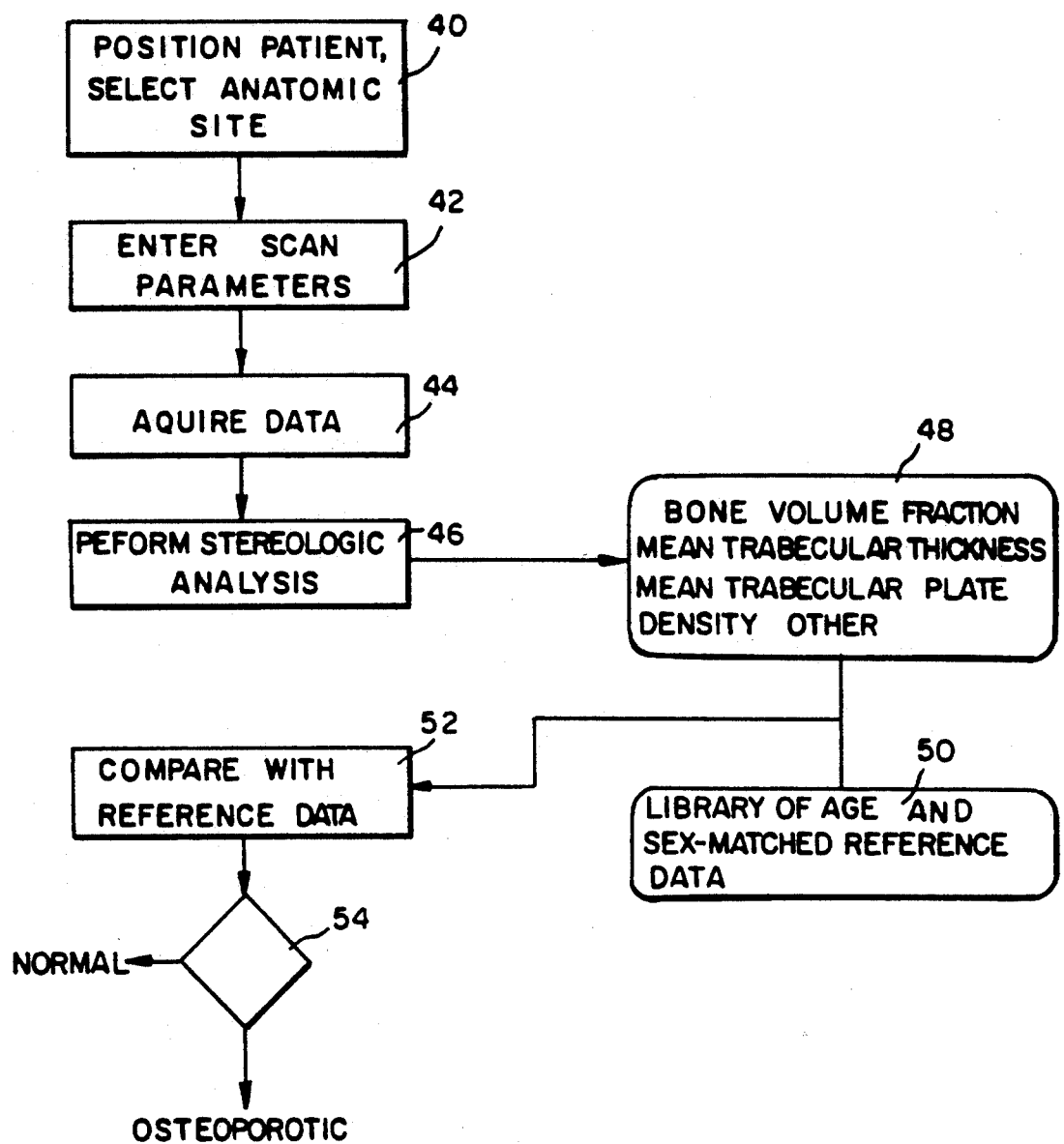
FIG. 4 is a flow diagram of one method for detecting osteoporotic bone in accordance with the present invention.

A flow chart of a procedure for detecting osteoporosis in a patient is shown in FIG. 4. At step 40, an anatomic site for analysis is selected and the patient is properly positioned with respect to the NMR imager. At step 42, the scan parameters are entered into the host computer. At step 44, the imaging data is acquired. At step 46, the above-described stereologic analysis is performed. At step 48, values are computed for the bone volume fraction, mean trabecular thickness and mean trabecular plate density. At step 52, the computed values are compared with corresponding values stored in a pre-stored library file 50 of age and sex-matched reference data. At step 54, a determination is made, on the basis of the comparison, of whether the patient is osteoporotic or normal.

The present invention thus provides noninvasive methods and apparatus for acquiring quantitative information about trabecular microstructure, particularly trabecular plate density, from an analysis of NMR imaging data. In addition, the present invention may be used to detect osteoporosis.

What is claimed is:

1. A method for detecting a condition of a mass of trabecular bone by nuclear magnetic resonance (NMR) imaging, comprising the following steps:
   (a) subjecting a first mass of trabecular bone to electromagnetic energy from an NMR imaging system so as to cause a response comprising at least a first parameter indicative of the density of the trabeculae of the first mass of bone;

(b) measuring said first parameter by obtaining NMR imaging data from said NMR imaging system in a region of interest, and performing at least the following steps: computing, on the basis of said NMR imaging data, a second parameter indicative of bone area in the region of interest; computing, on the basis of said second parameter, a third parameter indicative of trabecular thickness in said region of interest; and computing said first parameter on the basis of a ratio of said third parameter to said second parameter; and (c) comparing said first parameter with data corresponding to a second mass of bone having a known condition, whereby the condition of the first mass of bone is determined.

2. The method of claim 1, wherein the step of comparing said first parameter with data corresponding to a second mass of bone having a known condition comprises comparing the first parameter with trabecular density data for the second mass of bone that has a known trabecular structure.

3. The method of claim 2, further comprising determining on the basis of the comparison whether the first mass of bone is osteoporotic or normal.

4. The method of claim 3, wherein the step of computing said second parameter indicative of bone area comprises the following steps:
comparing the NMR imaging data for said region of interest to a prescribed first threshold value,
selecting a first portion of said data on the basis of said comparison with said first threshold value, and
computing a first weighted sum on the basis of said first portion, wherein said second parameter is based upon said first weighted sum.

5. The method of claim 1, wherein the step of computing said second parameter indicative of bone area comprises the following steps:
comparing the NMR imaging data for said region of interest to a prescribed first threshold value,
selecting a first portion of said data on the basis of said comparison with said first threshold value, and
computing a first weighted sum on the basis of said first portion, wherein said second parameter is based upon said first weighted sum.

6. An apparatus for detecting a condition of a mass of trabecular bone by nuclear magnetic resonance (NMR) imaging, comprising (a) first NMR imaging means for subjecting a first mass of trabecular bone to electromagnetic energy so as to cause a response comprising at least a first parameter indicative of the density of the trabeculae of the first mass of bone;

(b) second NMR imaging means for measuring said first parameter by obtaining NMR imaging data from a region of interest; wherein said second NMR imaging means comprises first computing means for computing, on the basis of said NMR imaging data, a second parameter indicative of bone area in the region of interest; second computing means for computing on the basis of said second parameter, a third parameter indicative of trabecular thickness in said region of interest; third computing means for computing said first parameter on the basis of a ratio of said third parameter to said second parameter;

(c) comparing means for comparing the said first parameter with data corresponding to a second mass of bone having a known condition, and (d) determining means, coupled to said comparing means, for determining the condition of the first mass of bone.

7. The apparatus of claim 6, wherein said comparing means comprises means for comparing said first parameter with trabecular density data for a second mass of bone that has a known trabecular structure.

8. The apparatus of claim 7, wherein said determining means comprises means for determining whether the first mass of bone is osteoporotic or normal.

9. The apparatus of claim 8, wherein said means for computing said second parameter indicative of bone area comprises
means for comparing said NMR imaging data for said region of interest to a prescribed first threshold value,
means for selecting a first portion of said data on the basis of said comparison with said first threshold value, and
means for computing a first weighted sum on the basis of said first portion.

* * * * *